United States Patent [19]

Yamanouchi

[11] Patent Number: 4,649,299
[45] Date of Patent: Mar. 10, 1987

[54] STROBE LINE DRIVER CIRCUIT

[75] Inventor: Roy K. Yamanouchi, San Jose, Calif.

[73] Assignee: National Semiconductor Corporation, Santa Clara, Calif.

[21] Appl. No.: 600,706

[22] Filed: Apr. 16, 1984

[51] Int. Cl.$^4$ .......................................... H03K 17/693
[52] U.S. Cl. .................................. 307/480; 307/452; 307/481; 307/241; 307/269
[58] Field of Search .................. 307/200 B, 443, 452, 307/480, 481, 453, 510, 518, 241, 244, 571, 579, 582–585, 269, 542, 544, 595, 605; 365/193

[56] References Cited

U.S. PATENT DOCUMENTS

| | | | |
|---|---|---|---|
| 3,449,594 | 6/1969 | Gibson et al. | 307/585 |
| 4,345,170 | 8/1982 | Sampson, III | 307/443 |
| 4,446,382 | 5/1984 | Moore et al. | 307/443 X |
| 4,488,066 | 12/1984 | Shoji | 307/443 X |
| 4,504,745 | 3/1985 | Spence et al. | 307/453 X |
| 4,581,549 | 4/1986 | Aoyama et al. | 307/452 |

Primary Examiner—Stanley D. Miller
Assistant Examiner—D. R. Hudspeth
Attorney, Agent, or Firm—Gail W. Woodward

[57] ABSTRACT

An improved strobe line driver circuit is disclosed that generates a plurality of strobe signals in response to a corresponding plurality of enable signals and a first clock signal. The circuit includes a clock enable transistor that generates a second clock signal. The circuit also includes a plurality of transistor pairs coupled to the first and second clock signals. Each transistor pair receives one enable signal and generates a corresponding strobe signal.

9 Claims, 3 Drawing Figures

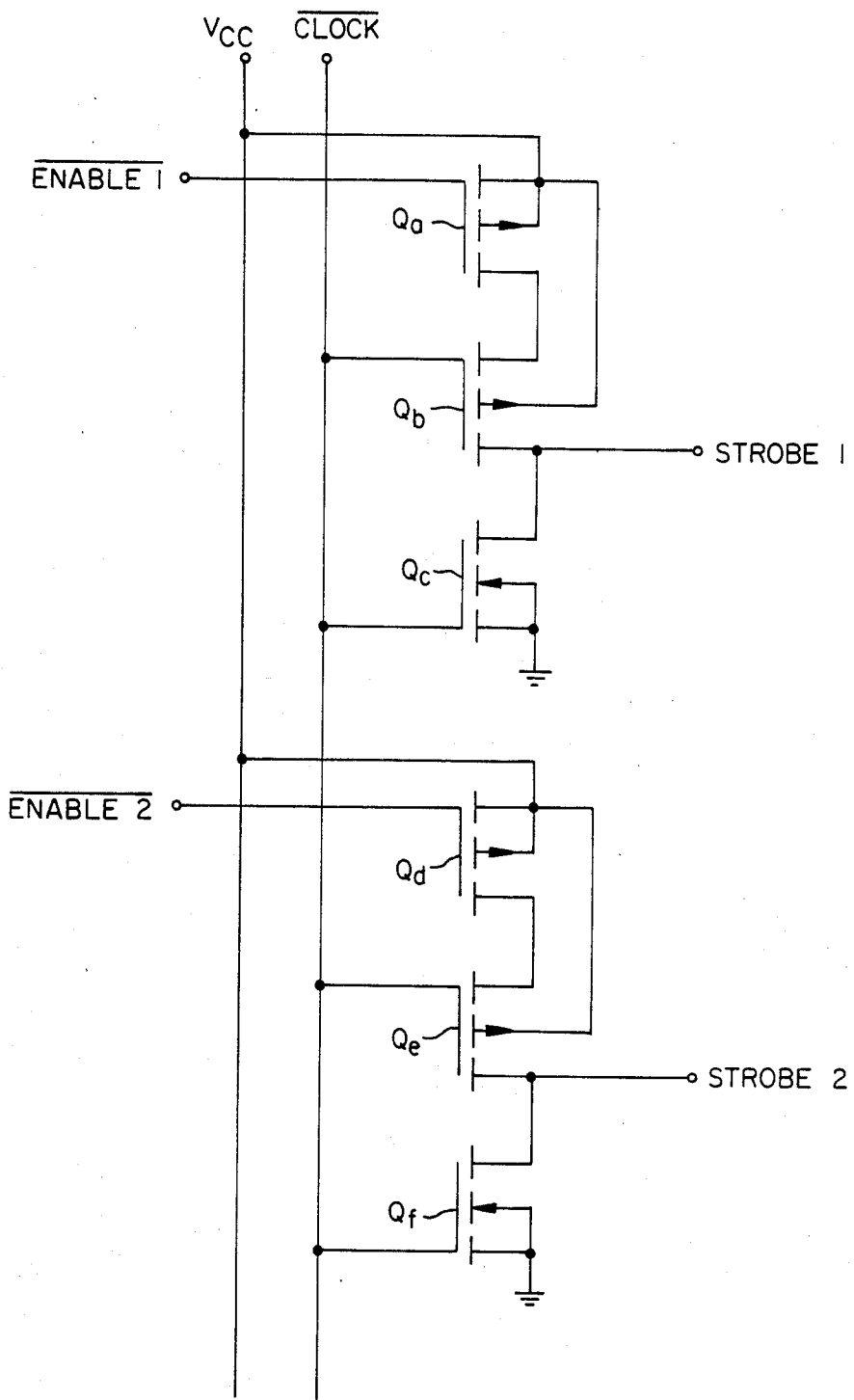
FIG._1.

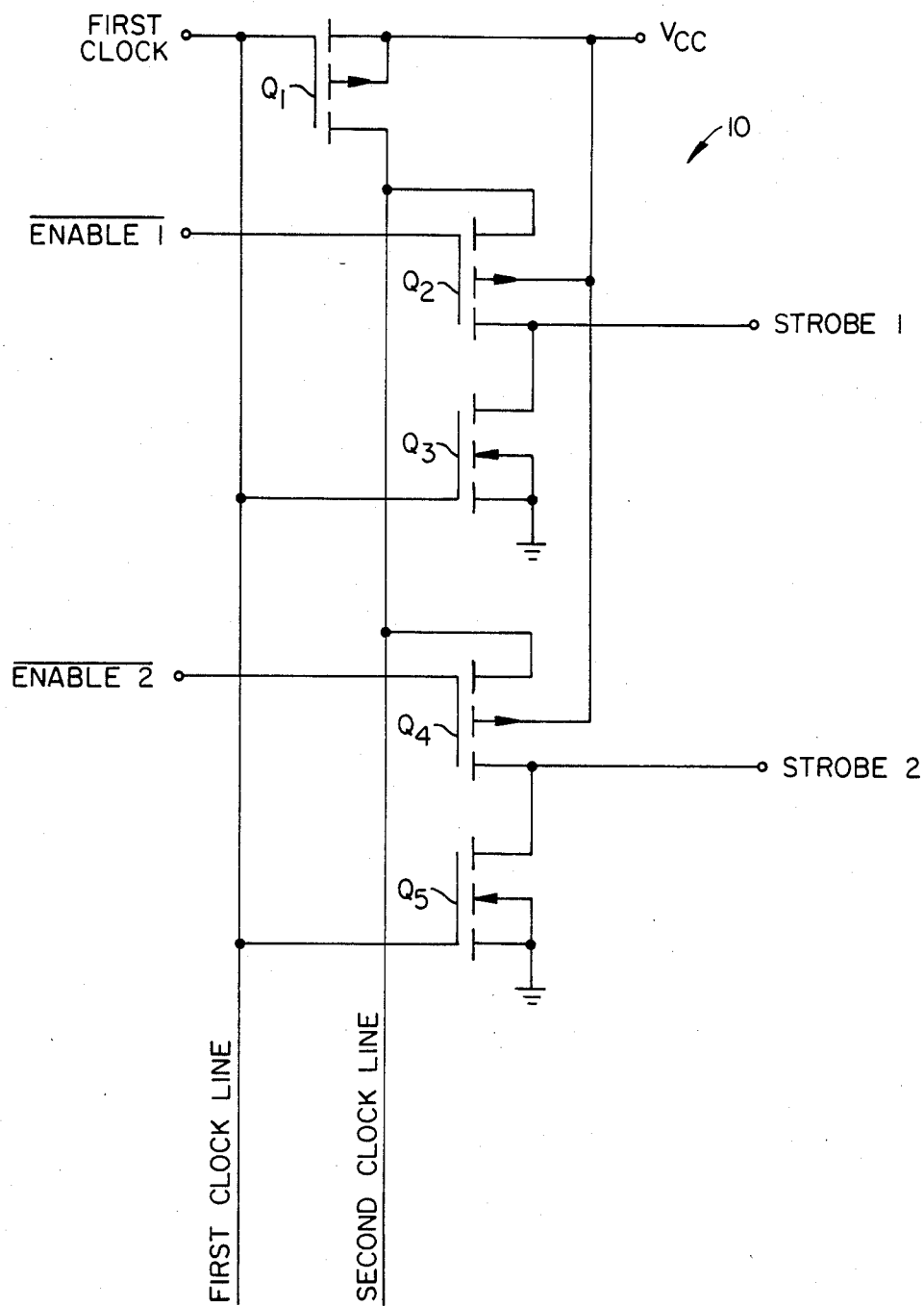
FIG._2.

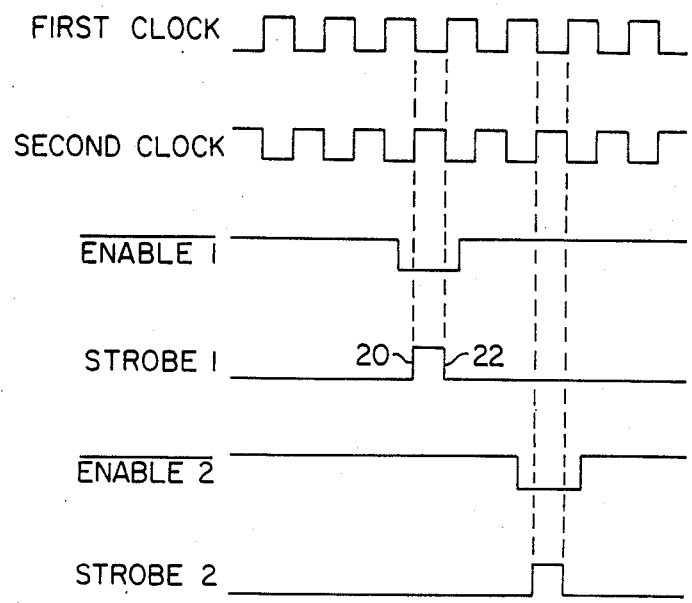
FIG._3.

STROBE LINE DRIVER CIRCUIT

BACKGROUND OF THE INVENTION

1. Field of the Invention

This invention relates generally to electronic circuits for use in microprocessors, and relates more particularly to an improved strobe line driver circuit.

2. Description of the Prior Art

Microprocessors commonly utilize strobe circuits to control internal data transfer. A microprocessor might have, for example, a thirty-two bit data bus and twenty temporary storage registers (each thirty-two bits wide). The temporary storage registers would be used for accumulating and temporarily storing data for transfer to the data bus. According to standard design practices, each register would be coupled to the data bus using thirty-two pull down transistors, one for each of the thirty-two lines of the data bus. Data transfer from a register to the data bus would be triggered by a strobe signal supplied to the pull down transistors. Such a microprocessor would require twenty strobe lines, each for triggering a specific register. The microprocessor would also require means for generating twenty separate strobe signals, each capable of driving thirty-two pull down transistors.

The timing of the strobe signals is defined by a system clock to ensure that the transfer of data occurs in an orderly fashion. The transfer of data to the data bus requires several steps: (1) data is stored in a register, (2) the data bus is precharged to a logic high voltage, (3) a corresponding strobe signal is supplied to the pull down transistors, and (4) the charge on the data bus is discharged to ground through the pull down transistors according to the data bits stored in the register. The timing of the strobe signals is critical. The strobe signals must be supplied to the pull down transistors after the data has been stored in the register and the data bus has been precharged. The duration of the strobe signals must be sufficient to allow the pre-charged data bus to discharge through the pull down transistors.

In addition to controlling the timing of the data transfer, the strobe signals also select registers for data transfer. Typically, a series of mutually exclusive enable signals are combined with a clock signal to generate the strobe signals. Each enable signal corresponds to a specific strobe signal and register. The enable signals determine which strobe signal is to be activated, and the clock signal determines the exact timing of the strobe signal.

An example of a prior art strobe line driver circuit is illustrated in FIG. 1. The strobe line driver circuit includes X groups of three transistors, where X equals the total number of strobe lines (X also equals the number of registers). In the example above, X is equal to twenty. Each group of three transistors is connected to a clock line and a positive voltage supply, Vcc. Each group of three transistors receives one enable signal, ENABLE-1-BAR for example, and generates one strobe signal, STROBE-1 for example.

In FIG. 1, transistors Qa, Qb, and Qc form one such group of three transistors. Transistors Qa and Qb are both p-channel enhancement-mode metal-oxide-semiconductor field effect transistors (MOSFETs), while transistor Qc is an n-channel enhancement-mode MOSFET. Transistor Qa has its source connected to Vcc, and has its drain connected to the source of transistor Qb. The gates of transistors Qb and Qc are connected to the clock line, while the drains of transistors Qb and Qc are connected together. The source of transistor Qc is grounded. The clock line carries a clock signal, CLOCK-BAR. An enable signal, ENABLE-1-BAR, is supplied to the gate of transistor Qa. A strobe signal, STROBE-1, is generated at the commonly connected drains of transistors Qb and Qc.

Transistors Qa, Qb, and Qc generate a strobe signal in response to the clock signal and an enable signal. The strobe signals are normally held at a logic low voltage. When a transfer of data is desired, the strobe signal pulses to a logic high voltage for one half clock period, and then returns to the logic low voltage. Transistors Qa and Qb form a NOR gate that defines the positive-going transition of the strobe signal. ENABLE-1-BAR is normally at the logic high voltage (disabled). The clock signal alternates between the logic low voltage and the logic high voltage. When ENABLE-1-BAR goes to the logic low voltage (enabled), transistor Qa changes to a fully conductive state (on). When the clock signal next goes to the logic low voltage, transistor Qb also changes to a fully conductive state (on), passing Vcc to the strobe line. Thus, when both transistors Qa and Qb are on, the strobe signal is at the logic high voltage.

The strobe signal remains at the logic high voltage until the clock signal rises to the logic high voltage one half clock period later. When the clock signal rises to logic high, transistor Qb is turned off and transistor Qc is turned on. Since transistor Qc provides a path to ground for the charge on the strobe line, the strobe signal falls to the logic low voltage (ground potential). Transistor Qc and the clock signal thus define the negative-going transition of the strobe signal. The strobe signal remains at the logic low voltage until both ENABLE-1-BAR and CLOCK-BAR are again logic low.

The strobe line driver circuit of FIG. 1 has certain limitations. A major limitation is that of speed. P-channel transistors Qa and Qb must have a large enough capacity in series to drive thirty-two pull down transistors, assuming a thirty-two bit data bus. The clock line must drive X of the p-channel transistors, such as Qb and Qe, where X equals the number of strobe lines. In addition, the clock line must drive X of the n-channel transistors, such as transistors Qc and Qf. To drive such a large load on the clock line, either a large driver must be used, or the clock rate must be restricted. Using a large clock driver device is undesirable because it would occupy a large chip area and require too much power. Using a slower clock is undesirable since the clock speed determines the operational speed and information processing capability of the microprocessor.

Another limitation of the strobe line driver circuit of FIG. 1 is that of device count and chip area. Since the circuit requires three transistors for each strobe line, a total of 3X transistors is required to support X registers. Further, the p-channel transistors are larger than the n-channel transistors, due to beta requirements associated with p-substrate type integrated circuits. Large current requirements, as well as the high device count and correspondingly high chip area of this prior art strobe line driver circuit makes it costly to use in high capacity microprocessors.

What is needed, then, is an improved strobe line driver circuit that can be effectively used in smaller, faster, and more power efficient microprocessors.

SUMMARY OF THE INVENTION

In accordance with the illustrated preferred embodiment, the present invention provides an improved strobe line driver circuit. The improved strobe line driver circuit of the present invention generates a plurality of strobe signals in response to a corresponding plurality of enable signals and a first clock signal. The improved strobe line driver circuit includes clock enable means for generating a complementary second clock signal, and also includes a plurality of gate means, coupled to receive the first clock, second clock, and enable signals, for generating the strobe signals.

A p-channel enhancement-mode metal-oxide-semiconductor field effect transistor (MOSFET) provides the clock enable means. This clock enable transistor is gated by the first clock signal to generate the second clock signal. The second clock signal is used to define the positive-going edges of the strobe signals, while the first clock signal is used to define the negative-going edges of the strobe signals. Recall that the prior art strobe line driver circuit described above used one clock signal to define the timing of the strobe signals. By dividing the timing definition of the strobe signals between two clock signals, the present invention reduces the drive load on the received clock signal.

Combinational and timing logic are provided by pairs of transistors that form the gate means. All transistor pairs are connected to first and second clock lines for receiving the first and second clock signals. In addition, each pair receives one enable signal and generates a corresponding strobe signal. Each transistor pair of the plurality of transistor pairs independently generates one strobe signal. Since there is one transistor pair for each strobe signal, plus one transistor in the clock enable means, the circuit has a total of 2X+1 transistors, where X equals the number of strobe lines.

Each transistor pair includes one p-channel and one n-channel enhancement-mode metal-oxide-semiconductor field effect transistor (MOSFET). The p-channel transistor is gated by the enable signal. When the p-channel transistor is turned on by the enable signal, it passes the second clock signal through to the strobe line to define the positive-going transition of the strobe signal. The n-channel transistor is gated by the first clock signal. It defines the negative-going transition of the strobe signal by discharging the strobe line to ground.

The strobe line driver circuit according to the present invention has several advantages over prior art strobe line driver circuits. A major advantage is that power requirements are reduced because the clock signal drives fewer devices: X n-channel plus one p-channel transistors, rather than X n-channel plus X p-channel transistors. A corresponding advantage is that the speed of operation is increased. A third advantage is that less chip area is required as a result of fewer devices: 2X+1 rather than 3X.

The strobe line driver circuit of the present invention is described herein according to an embodiment having a p-channel enhancement-mode MOSFET as the clock enable transistor, and paired p-channel and n-channel enhancement-mode MOSFETs as the gate transistors. As will be understood by those familiar with the art, the invention may be embodied in other specific forms without departing from the spirit or essential characteristics thereof. For example, the circuit of the present invention could be formed with an n-channel depletion-mode MOSFET as the clock enable transistor. Accordingly, the disclosure of the present invention is intended to be illustrative, but not limiting, of the scope of the invention.

BRIEF DESCRIPTION OF THE DRAWINGS

FIG. 1 is a schematic view of a prior art strobe line driver circuit.

FIG. 2 is a schematic view of a strobe line driver circuit according to the present invention.

FIG. 3 is a timing diagram of signals found in the strobe line driver circuit of FIG. 2.

DETAILED DESCRIPTION OF THE PREFERRED EMBODIMENT

The preferred embodiment of the present invention is a strobe line driver circuit 10, as illustrated in FIG. 2. The strobe line driver circuit generates a plurality of strobe signals, STROBE-1, STROBE-2, etc., in response to a corresponding plurality of enable signals, ENABLE-1-BAR, ENABLE-2-BAR, etc., and a first clock signal. Circuit 10 includes a clock enable transistor Q1 for generating a second clock signal, where the second clock signal is the complement of the first clock signal. Circuit 10 also includes a plurality of transistor pairs, Q2 and Q3, Q4 and Q5, for generating the strobe signals. Each strobe signal is the logical NOR combination of a corresponding enable signal and the first clock signal. In other words, when both an enable signal, such as ENABLE-1-BAR, and the first clock signal are at a logic low voltage, then the corresponding strobe signal, STROBE-1, is at a logic high voltage. Otherwise, the strobe signal is at the logic low voltage.

The clock enable transistor Q1 in the preferred embodiment is a p-channel enhancement-mode metal-oxide-semiconductor field effect transistor (MOSFET). The gate terminal of transistor Q1 is coupled to a first clock line that carries the first clock signal. The source terminal of transistor Q1 is connected to a positive power supply, Vcc, and the drain terminal is connected to a second clock line. The drain terminal of the clock enable transistor generates the second clock signal, which is used to define the positive-going edges of the strobe signals. The second clock signal is distributed to each of the transistor pairs through the second clock line.

Combinational and timing logic are provided by pairs of transistors that form the gate means. In FIG. 2, transistors Q2 and Q3 form one transistor pair, while transistors Q4 and Q5 form another transistor pair. Each transistor pair of the plurality of transistor pairs independently generates one strobe signal. While only two transistor pairs are illustrated in FIG. 2, circuit 10 includes several additional transistor pairs, adding up to a total of X pairs. Circuit 10 is capable of generating X strobe signals, one by each transistor pair.

Each transistor pair includes one p-channel and one n-channel enhancement-mode metal-oxide-semiconductor field effect transistor, Q2 and Q3, respectively. The gate terminal of transistor Q2 is coupled to an enable signal, ENABLE-1-BAR, and the source terminal is connected to the second clock line. The gate terminal of transistor Q3 is coupled to the first clock line, and the source terminal is connected to ground. The drain terminals of transistors Q2 and Q3 are connected in common, and are connected to a strobe line that carries the strobe signal STROBE-1.

Each of the several transistor pairs is connected within circuit 10 in a similar fashion. Each transistor pair is coupled to the first and second clock lines. The p-channel transistor of each pair is coupled to an enable signal, while the common connection between the two drains of each pair is connected to a strobe line.

In operation, transistor Q1 generates the second clock signal to lighten the drive load on the first clock signal. Since transistor Q1 is on when the first clock signal is at the logic low voltage, and is off when the first clock signal is at the logic high voltage, the second clock signal is the complement of the first clock signal. This relationship is shown in FIG. 3. The first and second clock signals are 180 degrees out of phase.

The first and second clock signals are utilized to respectively define the negative-going and positive-going edges of the strobe signals. The strobe signals are normally at the logic low voltage, and are activated by generating a high voltage pulse lasting one half clock period. The enable signals select which strobe signals are to be activated. An enable signal is normally at the logic high level (disabled), and falls to the logic low voltage to enable a strobe signal, as shown in FIG. 3.

To select strobe signal STROBE-1, enable signal ENABLE-1-BAR falls to the logic low voltage. Transistor Q2 is a p-channel transistor that turns on when the source voltage exceeds the gate voltage by an amount greater than its threshold voltage. Since the gate of transistor Q2 is coupled to the enable signal and the source of transistor Q2 is coupled to the second clock signal, transistor Q2 turns on when the enable signal is logic low and the second clock signal is logic high. When transistor Q2 is on, positive voltage Vcc is connected to the strobe line, and strobe signal STROBE-1 is logic high. Thus, when transistor Q2 is enabled by the enable signal, it passes the second clock signal through to the strobe line to define the positive-going transition of the strobe signal. This is shown at point 20 in FIG. 3.

The strobe signal remains logic high until the first and second clock signals change state, one half clock period later. When the second clock signal falls to logic low, transistor Q2 turns off, regardless of the state of the enable signal. At the same time, the first clock signal rises to logic high, causing transistor Q3 to turn on. Transistor Q3 discharges the electrical charge stored on the strobe line by providing a path to ground. This causes the strobe signal, STROBE-1, to fall to the logic low voltage. Thus, the first clock signal defines the negative-going transition of the strobe signal by discharging the strobe line through transistor Q3. This is shown at point 22 in FIG. 3.

At a later time, the next enable signal, ENABLE-2-BAR, initiates the generation of another strobe signal. When ENABLE-2-BAR is logic low and the second clock signal rises to logic high, transistor Q4 is turned on, causing the strobe signal, STROBE-2, to rise to logic high. At the next positive-going edge of the first clock signal, one half clock period later, transistor Q4 turns off and transistor Q5 turns on, causing the strobe signal to fall to logic low.

The strobe line driver circuit 10 has several advantages over similar prior art circuits. Power requirements are reduced because the clock signal drives fewer devices: X n-channel plus one p-channel transistors, rather than X n-channel plus X p-channel transistors. Another advantage is that the part count is reduced from 3X to 2X+1, which requires less chip area.

In implementing circuit 10, the drive requirements of transistor Q1 must be considered. Transistor Q1 drives the second clock line, which is coupled to the sources of X transistors; Q2, Q4, etc. The rise time of the second clock signal is affected by the capacitance between each source and the underlying substrate. In order to minimize the capacitance between each source and the substrate, applicant recommends the use of circular geometry MOSFETs as disclosed in his co-pending application Ser. No. 600,705 entitled "CIRCLE DRIVERS FOR A HIGH SPEED DATA BUS DRIVER CIRCUIT," filed concurrently with the present application, and assigned to the same assignee.

From the above description, it will be apparent that the invention disclosed herein provides a novel and advantageous strobe line driver circuit. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A strobe line driver circuit for generating a plurality of strobe signals in response to a corresponding plurality of enable signals and a first clock signal, said circuit comprising:
   clock enable means, responsive to said first clock signal, for generating a second clock signal; and
   a plurality of gate means for generating said strobe signals, wherein said first and second clock signals define the timing of said strobe signals, and wherein each of said gate means is coupled to receive a respective one of said enable signals, and is operable for generating one of said strobe signals in response to said one of said enable signals, each of said plurality of gate means including a first gate, coupled to receive said second clock signal, and operable for defining positive-going transitions of a strobe signal and a second gate, coupled to receive said first clock signal, and operable for defining negative-going transitions of said strobe signal.

2. A circuit as recited in claim 1 wherein said clock enable means comprises a first field effect transistor having said first clock signal applied to a gate terminal thereof for controlling the flow of current through source and drain terminals thereof, and wherein said second clock signal corresponds to said flow of current.

3. A circuit as recited in claim 2 wherein said first field effect transistor is a p-channel enhancement-mode metal-oxide-semiconductor field effect transistor having a positive voltage applied to said source terminal, and having said second clock signal generated by said drain terminal.

4. A circuit as recited in claim 3 wherein said first gate is a second field effect transistor having said enable signal applied to a gate terminal thereof and having said second clock signal applied to a source terminal thereof, and wherein said strobe signal is generated by a drain terminal thereof.

5. A circuit as recited in claim 4 wherein said second field effect transistor is a p-channel enhancement-mode metal-oxide-semiconductor field effect transistor.

6. A circuit as recited in claim 4 wherein said second gate is a third field effect transistor having said first clock signal applied to a gate terminal thereof, having a source terminal thereof coupled to ground, and having a drain terminal thereof connected to said drain terminal of said second field effect transistor.

7. A circuit as recited in claim 6 wherein said third field effect transistor is an n-channel enhancement-mode metal-oxide-semiconductor field effect transistor.

8. A strobe line driver circuit for generating a plurality of strobe signals in response to a corresponding plurality of enable signals and a first clock signal, said circuit comprising:
 a first p-channel enhancement-mode metal-oxide-semiconductor field effect transistor for generating a second clock signal, wherein said first clock signal is applied to a gate terminal thereof and a positive voltage is applied to a source terminal thereof, and wherein said second clock signal is generated by a drain terminal thereof; and
 a plurality of gate means for generating said strobe signals, wherein each of said gate means includes one p-channel and one n-channel enhancement-mode metal-oxide-semiconductor field effect transistor for generating a strobe signal at commonly connected drain terminals thereof, said p-channel transistor having one of said enable signals applied to a gate terminal thereof and having said second clock signal applied to a source terminal thereof, and said n-channel transistor having said first clock signal applied to a gate terminal thereof and having a source terminal thereof coupled to ground.

9. A strobe line driver circuit for generating a plurality of strobe signals in response to a corresponding plurality of enable signals and a clock signal, said circuit comprising:
 a first p-channel enhancement-mode metal-oxide-semiconductor field effect transistor, wherein said clock signal is applied to a gate terminal thereof and a positive voltage is applied to a source terminal thereof; and
 a plurality of gate means for generating said strobe signals, wherein each of said gate means includes one p-channel and one n-channel enhancement-mode metal-oxide-semiconductor field effect transistor coupled together for generating a strobe signal at commonly connected drain terminals thereof, said p-channel transistor having one of said enable signals applied to a gate terminal thereof and having a source terminal thereof connected to a drain terminal of said first p-channel transistor, and said n-channel transistor having said clock signal applied to a gate terminal thereof and having a source terminal thereof coupled to ground.

* * * * *